US 7,400,170 B2

(12) United States Patent
Bitting

(10) Patent No.: US 7,400,170 B2
(45) Date of Patent: Jul. 15, 2008

(54) DIFFERENTIAL CURRENT-MODE DRIVER WITH HIGH COMMON-MODE RANGE AND CONTROLLED EDGE RATES

(75) Inventor: Rick Bitting, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 154 days.

(21) Appl. No.: 11/413,497

(22) Filed: Apr. 28, 2006

(65) Prior Publication Data

US 2007/0252619 A1 Nov. 1, 2007

(51) Int. Cl.
*H03K 19/0175* (2006.01)
*H03K 19/094* (2006.01)
(52) U.S. Cl. .............................. 326/82; 326/58; 326/86; 326/87; 326/115
(58) Field of Classification Search ............. 326/82–83, 326/86–87, 112, 115, 56–58
See application file for complete search history.

(56) References Cited

U.S. PATENT DOCUMENTS

| 5,767,699 | A | * | 6/1998 | Bosnyak et al. ............... 326/86 |
| 5,880,601 | A | * | 3/1999 | Kanazawa et al. ............. 326/68 |
| 6,107,856 | A | | 8/2000 | Bitting ........................ 327/307 |
| 6,160,424 | A | * | 12/2000 | Migliavacca .................. 327/65 |
| 6,806,744 | B1 | * | 10/2004 | Bell et al. ..................... 327/70 |
| 6,867,618 | B2 | * | 3/2005 | Li et al. ......................... 326/83 |
| 7,248,079 | B2 | * | 7/2007 | Bhattacharya et al. ......... 326/83 |
| 2004/0155680 | A1 | * | 8/2004 | Icking et al. .................. 326/83 |
| 2005/0280441 | A1 | * | 12/2005 | Sommer ....................... 326/83 |
| 2006/0220674 | A1 | * | 10/2006 | Yeung et al. .................. 326/29 |

OTHER PUBLICATIONS

LVDS I/O Interface for Gb/s-per-Pin Operation in 0.35-μm CMOS; Andrea Boni, Member, IEEE, Andrea Peirazzi, and Davide Vecchi; IEEE Journal of Solid-State Circuits, vol. 36, No. 4, Apr. 2001.

* cited by examiner

*Primary Examiner*—Rexford Barnie
*Assistant Examiner*—Jason M Crawford
(74) *Attorney, Agent, or Firm*—Suiter Swantz PC LLO

(57) ABSTRACT

A differential current-mode driver that meets the IEEE 1394 standard employs a wide output range in common-mode voltage, minimizes timing skew over this wide range, and has well-controlled rise/fall times in the edge rates of the digital signals transmitted, within the window specified by the IEEE 1394 standard, without having to resort to full-swing ($V_{DD}$ to $V_{SS}$) gate drive signals. In a preferred embodiment PMOS and NPOS transistors are used to provide current for a current driver, in the form of a current steering switch switching a pair of current mirrors. The current mirrors output is input to a predriver waveform circuit which divides current between a data source A and data source B, forming the differential signal pair. Certain key transistors in the current driver are kept in saturation to improve performance. Upper and lower voltages used for the voltage swing necessary for the predriver waveform circuit and transmit driver are generated by P-channel and N-channel input opamps in a predriver reference generator circuit.

14 Claims, 13 Drawing Sheets

DIFFERENTIAL CURRENT-MODE DRIVER WITH HIGH COMMON-MODE RANGE AND CONTROLLED EDGE RATES

CROSS-REFERENCE TO RELATED APPLICATIONS

[none]

BACKGROUND OF THE INVENTION

1. Field of Invention

The present invention relates generally to the field of serial-bus drivers for the IEEE 1394 standard.

2. Description of Related Art

FireWire is a serial bus standard that was developed jointly by Apple, Intel, Texas Instruments, Microsoft, Sun Microsystems, Compaq and National Semiconductor, and is now an IEEE standard, IEEE 1394. IEEE 1394 has numerous advantages: it supports isochronous applications, where data delivery must be guaranteed only at the endpoints in a time period, it has a large address space available, which allows a large number of devices per bus to be connected, it supports "hot-swapping" of devices, and it supports a fast transfer speed, up to 400 Mb/s, or potentially greater.

One way IEEE 1394 supports a fast transfer speed is through differential signal transmission at the PHY (the physical level in the Open Systems Interconnect (OSI) ISO standards framework for communications). IEEE 1394 specifies both common mode (DC) and differential signaling, and reserves the bulk of transmissions for differential signaling. DC signaling, where a logical 1 is represented as positive voltage and a logical zero is represented as zero voltage is reserved in IEEE 1394 for only three purposes: device attachment and detection, speed signaling and power management (e.g. a suspend function). By contrast, differential signaling is used for the remaining majority of operations, such as data packet transmissions, bus reset, arbitration, and configuration commands. However, the presence of DC signaling in IEEE 1394 presents a problem to designers of serial bus drivers because the IEEE 1394 standard requires a wide output for the common-mode voltage range.

Differential signaling, such as shown in FIG. 1, uses the difference in voltage level between two wires (or traces) to signal information. If the voltage on one wire is greater than the voltage on another wire, a logical 1 is represented, and vice versa. Differential signals in a dual trace use lower voltage swings than single-ended signals, which can result in faster circuits with lower power consumed over a wide range of frequencies transmitted. Because the signals traveling in dual traces in differential signaling typically travel in opposite directions, differential signaling reduces the need for shielding traces, thus it reduces EMI (Electro-Magnetic Interference) and cross-talk. The presence of two traces (or conductors) to convey a signal results in noise tolerance in the form of common-mode voltage rejection (voltage common to both sides of a differential circuit pair canceling out, being out of phase, when the lines are perfectly balanced, so noise coupled onto the two wires equally, as common-mode noise, will be rejected by the differential signal receiver). Further, tighter router densities are possible and the absence of a complex termination strategy, as is often found in a single-ended signal trace, results in fewer parts in a board.

FIG. 1 shows a prior art schematic for a differential-signal driver and receiver, taken from the Port Interface diagram of the IEEE 1394 standard (FIG. 4-12 of IEEE Std. 1394a-2000). The importance of the IEEE 1394 specifications is to emphasize the timing skew (of data relative to strobe, TPA/TPB) and rise/fall time requirements over a wide output common-mode range, which the present invention seeks to meet and exceed. In FIG. 1 are shown the twisted pair interfaces—TPA/TPA* and TPB/TPB* (twisted pair TPA of port 1 connects to TPB of port 2 and vice versa), over which a pair of twisted-pair copper cables typically connect. A constant current source driver transmits a differential signal on one side, while on the other side there is the receiver (the IEEE 1394 standard is for transceivers, so there is a driver and receiver on both sides of the twisted pair channel); the FIG. 1 differential-signal driver and receiver is bi-directional. The current driver injects a small current into one wire or the other of the two conductors of the differential pair lines, depending on the logic level to be sent. The current passes through the receiving end at the receiver, and the receiver, having a high DC input resistance, results in the majority of the driver current flowing through a low resistance termination resistor, in FIG. 1 shown as a 55 Ω resistor (which may further be matched to the characteristic impedance of the twisted pair channel). The current injected returns in the opposite direction along the other wire in the twisted pair. From Ohm's Law the voltage difference across the resistor is sensed by the receiver, which also senses the polarity of the voltage (positive or negative), to determine the logic level. This is termed current loop signaling.

The IEEE 1394 standard, however advantageous, does demand certain exacting conditions for designing the driver in a IEEE 1394 serial bus, e.g., in the way of a wide common-mode voltage output range and controlled edge rates, that are not shared by similar differential signaling schemes, such as for LVDS (Low Voltage Differential Signaling). An example of an LVDS I/O interface for a high-speed I/O circuit is found in Boni et al. "LVDS I/O Interface for Gb/s-per-Pin Operation in 0.35-um CMOS" (IEEE J. of Solid-State Circuits, Vo. 36, No. 4, Apr. 2001, pp. 706-11).

First, there is the requirement in IEEE 1394 that DC signaling be used for device attachment and detection, speed signaling and power management, that results in having to design a wide output range in voltage for the common-mode voltage.

Second, there is the requirement in IEEE 1394 that the clock be transmitted along with the signal being transmitted in a twisted wire pair, with the data in the twisted wire pair XOR'd (Exclusive-OR) to extract the clock. This puts a premium on minimizing timing skew and requires low timing skew over a wide range of common-mode voltage ranges. In FIG. 1, data and strobe use the separate TPA and TPB twisted pairs, and can be different common-mode voltages due to drop in the ground line, and speed signaling.

Third, the IEEE 1394 specification, though isochronous, demands well-controlled rise/fall times in the edge rates of the digital signals transmitted. The rise/fall times of the digital signals cannot be too fast nor too slow, but have to lie within a window specified by the IEEE 1394 standard.

As in the present invention, existing current mode drivers that meet the IEEE 1394 standard exist. However, while these drivers may share similarities in the current steering switches, they lack the configuration of the present invention, and typically these drivers use full-swing ($V_{DD}$ to $V_{SS}$ gate drive signals). What is lacking in the prior art is the present invention method and apparatus of using reduced-swing gate drive for meeting the IEEE 1394 serial bus standard, that achieves low timing skew over a wide range of common-mode voltage ranges with well-controlled rise/fall times, without having to resort to full-swing ($V_{DD}$ to $V_{SS}$) gate drive signals. Reduced-swing gate drive has two benefits: (1) output rise/fall time relates more directly to input rise fall time since the output stage is in its linear region more of the time (the differential pair forming the current steering switches will be a straight line, i.e. linear, for small differential input amplitudes, then saturate to a fixed value at higher plus and minus input levels), and (2) the current steering switches operate in saturation mode versus the linear region, so that the common-source voltage does not vary with output common-mode level voltage.

SUMMARY OF THE INVENTION

Accordingly, an aspect of the present invention is for a method and apparatus for a differential current mode serial-bus driver circuit meeting the IEEE 1394 serial bus standard, that achieves low timing skew over a wide range of common-mode voltage ranges with well-controlled rise/fall times, using reduced-swing gate drive, without having to resort to full-swing ($V_{DD}$ to $V_{SS}$) gate drive signals.

The present invention achieves the advantages of low skew, well-controlled rise/fall times and a wide range of common-mode voltage output through a novel configuration that minimizes noise, and meets or exceeds the latest IEEE 1394 standard (IEEE Std. 1394a-2000).

The present invention employs a current driver in the form of a current steering switch comprising a pair of current mirrors whose output is input to a predriver waveform circuit (transmit driver) which divides current between a data source A and data source B, forming the differential signal pair.

PMOS and NMOS transistors are used in a current driver having current steering switches for a current sources. In addition, certain transistors in the current driver are kept in saturation to improve their characteristic performance.

The current steering switch and transmit driver of the present invention has a "make before break" path to allow differential signaling in a seamless manner without interruption of current.

The pre-driver reference generator of the present invention is designed to keep certain high and low voltages as close to $V_{DD}$ and $V_{SS}$ as possible, to keep certain key transistors of the transmit driver of the present invention are in saturation and maintain the benefits of reduced-swing gate drive mentioned above.

In the present invention three flip flops are used in a novel configuration to synch incoming differential data input to the current driver so the data is synchronous to the clock for the current driver and the edge rise/fall rates are correct.

Upper and lower voltages used for the voltage swing necessary for the predriver waveform circuit (transmit driver) and the current driver circuit are generated by a P-channel and N-channel input opamps, which act as buffers in a predriver reference generator.

Diodes connected to PMOS and NMOS transistors at their inputs set the voltage reference levels that control the switching in the predriver reference generator.

When the present invention is in Tri-state mode, such as when the circuit has to act as receiver rather than transmitter, the present invention provides an alternate path in the transmit driver for current to go to, a make-before-break circuit, to avoid having to shut off the current sources.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

Figure 1:
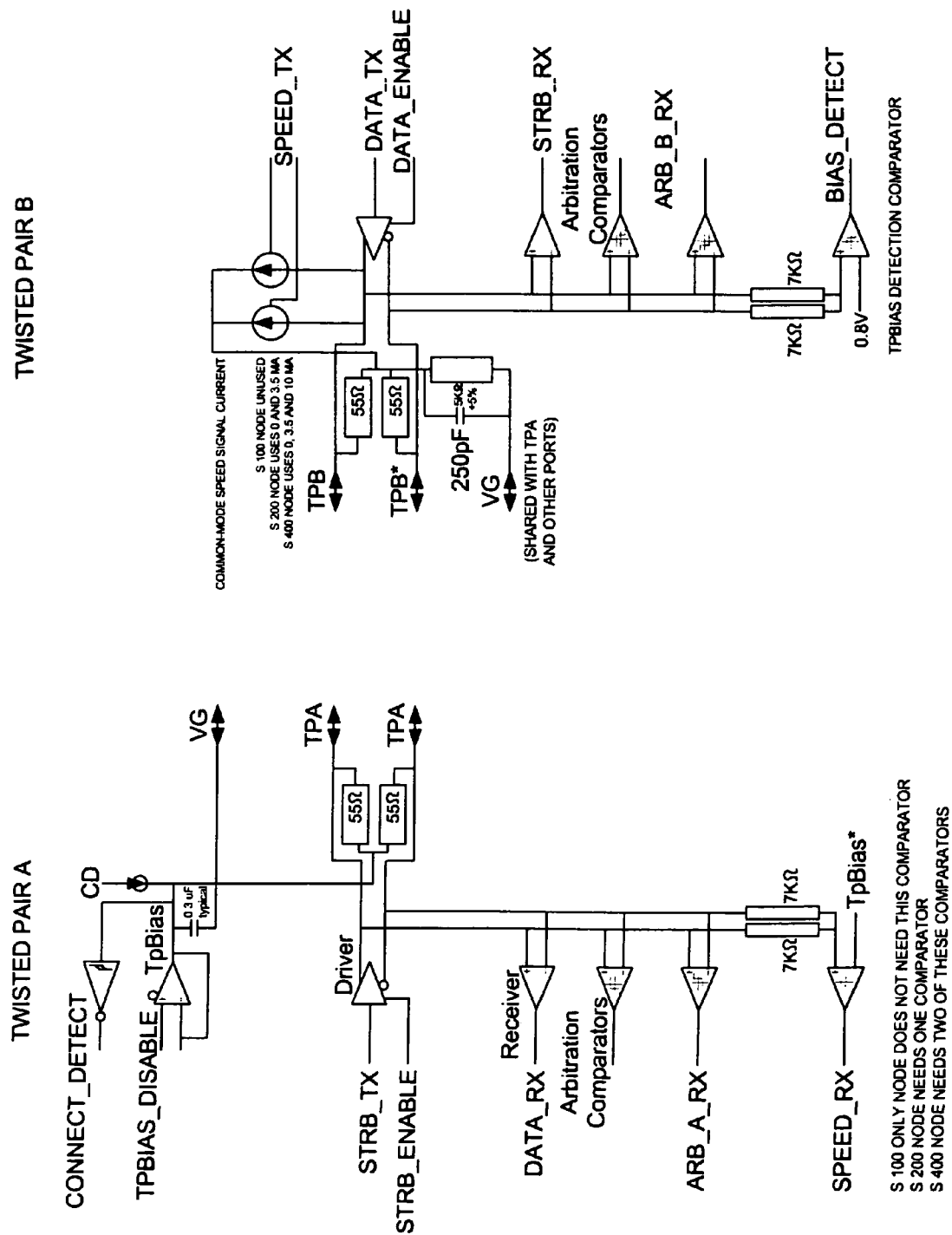
FIG. 1 is prior art illustrating the IEEE-1394 serial bus port interface standard (IEEE STD. 1394A-2000), including the driver, which the present invention improves upon.

It should be understood that one skilled in the art might, using the teachings of the present invention, vary embodiments shown in the drawings without departing from the spirit of the invention herein.

For the purposes of clarity in the schematics, to eliminate excessive clutter with lines, symbolic trace notation has been used for traces, thus two lines marked "VDDA" means they both are connected to the same source node. Likewise, alphanumeric indicia are used along with numeric reference numbers for identifying elements.

DETAILED DESCRIPTION OF THE INVENTION

Turning attention to FIG. 1 (prior art), from FIG. 4-12 of the IEEE-394 specification, IEEE Std. 1394a-2000, there is shown a single cable port consisting of two differential twisted-pair line transceivers (TPA/TPA* and TPB/TPB*). When two ports are connected via an interface cable, TPA of port 1 connects to TPB of port 2 and vice versa. Twisted pair A transmits the Strobe signal. Strobe transitions whenever data does not, such that the XOR with data produces a periodic waveform. Twisted pair A receives Data (e.g. data to be transmitted) while twisted pair B transmits Data and receives Strobe. Each twisted-pair transceiver consists of a +/−4 ma differential current driver, a data receiver (comparator), and two arbitration comparators. TPA also utilizes two additional comparators for receiving the common-mode speed signal. Twisted-pair A also transmits TpBias (Twisted-Pair common-mode Bias voltage), which sets the common-mode DC bias (DC level around which the AC differential signals oscillate)

of the line via two external 55-ohm termination resistors. TPB transmits the common-mode speed signal current (0, −3.5 ma, or −10 ma), and receives TpBias. TpBias is sensed by a 'Port_Status' comparator to determine that a cable connection exists.

The transceiver in FIG. 1 will support data rates of 98.304 MBit/sec (S100), 196.608 MBit/sec (S200), and 393.216 MBit/sec (S400).

The present invention is designed to confirm to the parameters in the following table, which is drawn from the IEEE standard, in reference to the figures and in particular FIG. 1.

including 0V); the voltages VDDL and VSSL are logic supply voltage, typically 1.0-1.8V. The fact that the logic and analog supplies are different is not material to the present invention, and any type of supply voltage can be used. Numerical traces are referenced as alpha-numeric indicia as shown, rather than showing physical lines, to avoid clutter. The values of device elements, such the width and length of the MOSFET (MOS) transistors, and the 'mult' W total=W*mult are for this particular instantiation and in general do not have to assume these values, although ratios are important for operation of

| Parameter | Min. | Typical | Max. | Units | Conditions |
|---|---|---|---|---|---|
| Supply Voltage (on power grid) | 3.1 | 3.3 | 3.465 | V | Full spec |
| Supply Voltage (on power grid) | 3.0 | 3.3 | 3.465 | V | Reduced output CM range |
| TpBias output voltage | 1.665 | 1.85 | 2.015 | V | |
| TpBias charge time | | | 1.0 | ms | To within spec. window |
| TpBias discharge time | | | 0.5 | ms | To <0.1 V |
| Transmit jitter | −100 | | 100 | ps | data and strobe |
| Transmit skew | −200 | | 200 | ps | data relative to strobe |
| Differential output voltage | 172 | 220 | 265 | mV | Peak |
| Differential output voltage | 374 | 440 | 530 | mV | peak-to-peak |
| Output common-mode voltage - TPA/TPB | 0.523 | | 2.515 | V | low-speed operation |
| Output common-mode voltage - TPA | 1.665 | | 2.015 | V | Full-speed operation |
| Output common-mode voltage - TPB | 1.165 | | 2.515 | V | Full-speed operation +/−0.5 V cable power drop |
| TPA/TPB differential output resistance | 105 | | 111 | Ohms | Transmit mode |
| TPA/TPB differential output resistance | 109 | | 111 | Ohms | Receive mode |
| Output rise or fall time | 0.5 | | 1.2 | ns | S400 - 10% to 90% |
| Output overshoot | −10 | | 10 | % | |

The conditions for the above table are defined as follows (refer to the IEEE 1394 standard for more information, incorporated by reference herein): S100, S200 and S400 refer to nodes having data rates of: 98.304 MBit/sec (S100), 196.608 MBit/sec (S200), and 393.216 MBit/sec (S400); Transmit mode is for a node to transmit a signal; Receive mode is for a node to receive a signal.

Figure 2A:
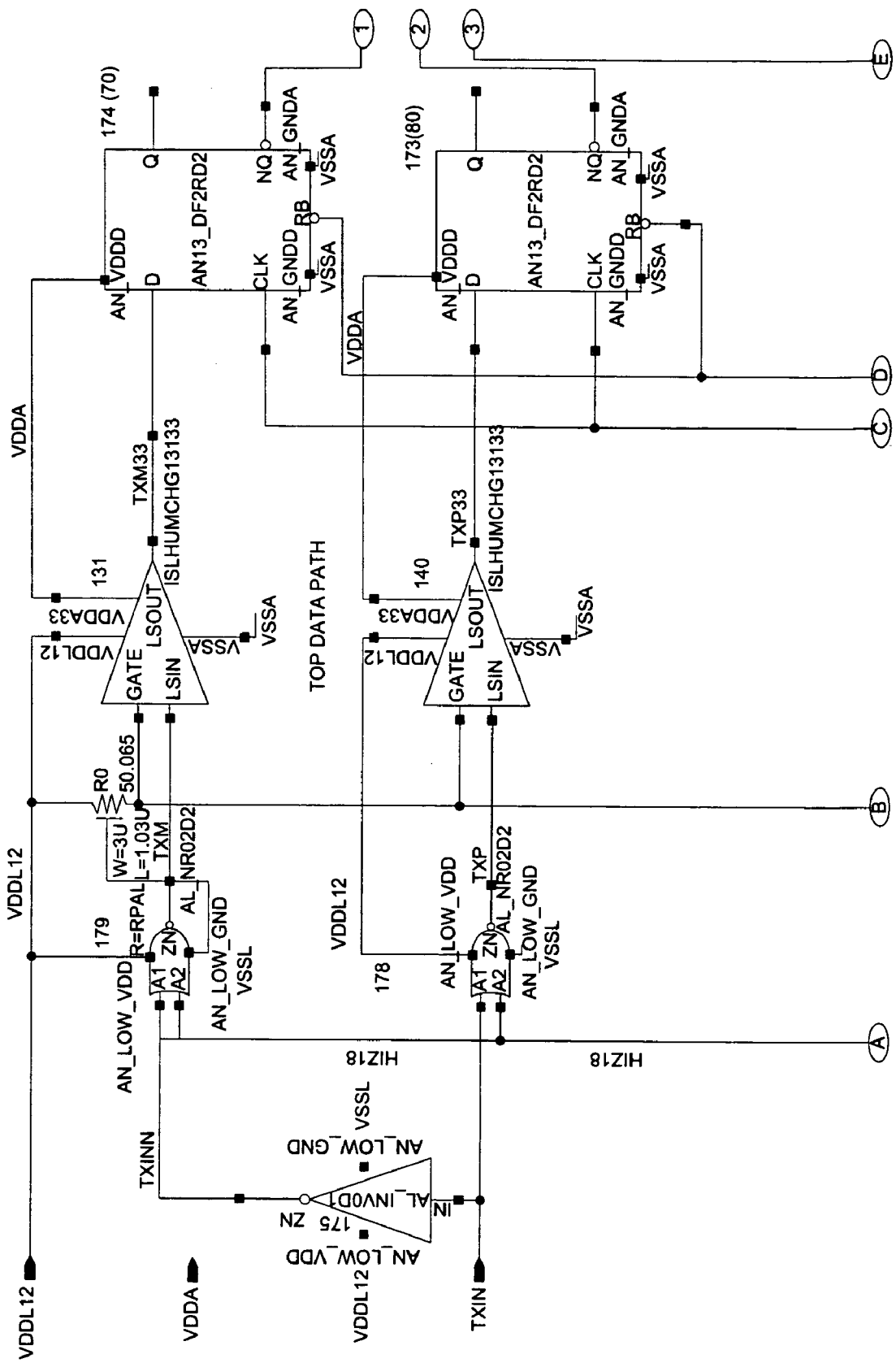
FIG. 2 (FIGS. 2A, 2B) is a schematic of a circuit used to synchronize waveforms CP, CM and VTRI prior to input to the transmit driver of the present invention.
Figure 2B:
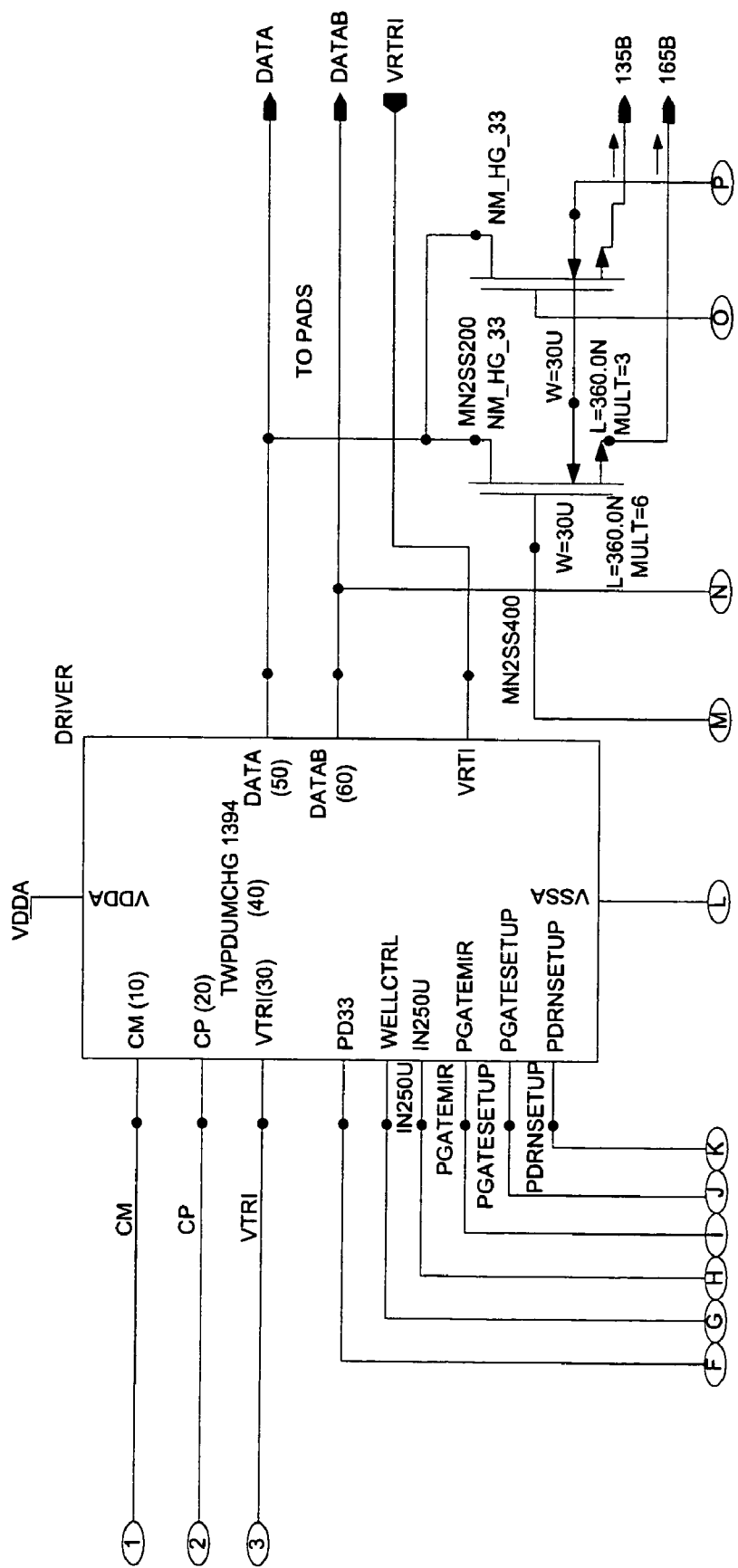

Turning attention now to FIG. 2, where parenthetical numbers refer to reference numbers in the figures and alphanumeric references are as shown, there is shown a schematic used to synchronize waveforms CM (10), CP (20), and VTRI (30') prior to their input to the transmit driver of the present invention (FIG. 3), the circuit labeled "twpdumchg1394" (40).

Input signals CM (20), CP (20) (the differential data inputs) correspond, respectively, to the signals that will form the differential data outputs A (50), B (60). VTRI (30') is the three-state (Tri-state) control input, and the signal VRTRI is related to the operation of the three-state control signal. These signals are processed by the circuit labeled "twpdumchg1394" (40). The transmit driver "twpdumchg1394" (40) is described further in connection with FIG. 3, the transmit driver. The three-state control signal VTRI is used in IEEE 1394 for DC signaling. Tri-state is used to switch the port to receive mode (transmitter is high-Z impedance).

The function of the three flip-flops 70, 80, 90 in FIG. 2 (labeled as 174, 173 and 172 respectively) are to synchronize the three waveforms for CP, CM and VTRI to the same clock, which is shown as clock lines CLKIN and clk in the flip-flops 70, 80, 90, which are positive edge triggered D flip-flops.

The voltages VDDA and VSSA (3.3V) are related to positive and negative supply voltages (with negative voltages the current mirrors and the reference generator of the present invention as instantiated in the figures.

The essential function of the circuit of FIG. 2 is to synchronize waveforms CP, CM and VTRI prior to input to the transmit driver of the present invention so they all rise and fall on the same clock (e.g. rising edge) when input into the transmit driver (FIG. 3), labeled "twpdumchg1394" in FIG. 2. In FIG. 2, the inputs of importance to the present invention are CP, CM and VTRI, and the fact that they are synchronous. FIG. 2 is one instantiation for a circuit to make the input waveforms CP, CM and VTRI synchronous.

Turning attention now to FIG. 3, there is shown the transmit driver (predriver waveform circuit) of the present invention, which forms a crucial component important for steering the current provided by the current source drivers into one or the other of the differential signal pair output wires. In order for the driver delay to be independent of output common-mode voltage, all current steering transistors must remain in saturation. This practice assures that the CS_TOP and CS_BOT node voltages do not change with common-mode level. The nodes supplied by CS_TOP and CS_BOT have relatively high capacitance and cannot change quickly. A "make-before-break" switch sequencing circuit (from the RS latch predriver, described herein) also minimizes transient spikes on the CS_TOP and CS_BOT supplied nodes.

Thus in FIG. 3, the transmit driver of the present invention, there is shown internal details of the circuit labeled "twpdumchg 1394" (40) in FIG. 2. The transmit driver of FIG. 3 comprises a pair of current source drivers (a pair of current mirrors), shown as the dashed circled areas 11 and 15; two pairs of gate biasing predriver circuits, shown as the circled areas 30, 31, 32 and 33; and current steering switches comprising transistors labeled MPSW1, MNSW1, MPSW2, MNSW2.

The transmit driver of FIG. 3 achieves the three conditions specified above and meets the IEEE 1394 specification, namely, to achieve wide output range in voltage for the common-mode voltage, to minimize timing skew over a wide range of common-mode voltage ranges, and to achieve well-controlled rise/fall times in the edge rates of the digital signals transmitted by the transmit driver.

Regarding the current mirrors at 11 and 15, which provide the current source to achieve the current loop signaling used for differential signaling, PMOS transistors are used for a current source (at 11) and NMOS transistors are used for a current sink (at 15). While in general MOSFET transistors are used throughout the present invention, with polysilicon gates, any type of IGFET or JFET class transistor may be used, given the teachings of the present invention.

Parameters listed next to transistors in FIG. 3 are preferred for the MOSFET transistors employed given the voltage and currents specified, but should not be taken as limiting the invention to just these parameters. Different transistor families will have different device characteristic parameters, and likewise different voltages and currents within the same transistor family will give different parameters.

MOSFET P-channel (PMOS) transistors MPSETUP and MPMIR form a first current mirror (a current source). The two transistors are suitably biased, given the supply voltages VDDA and VSSA (+3.3V and 0V, respectively) to conduct, and are suitably balanced so the two transistors are matched so that the two branches of the current mirror will have similar characteristics.

In the FIG. 3 embodiment the PMOS transistor MPSETUP (121), used for the first current mirror, has a device width W=30 u, length L=1.68 u, and a mult (number of parallel legs/branches on the die) =8; and PMOS transistor MPMIR (122) has W=30 u, L=1.68 u, and mult=256. The ratio of mult. is the current gain, 256/8=32×125 uA=4000 uA=4 mA, as shown in the source lead of PMOS transistor MPMIR of FIG. 3.

Similarly, MOSFET N-channel (NMOS) transistors MNSETUP (144) and MNMIR (166) form a second current mirror (a current sink) in FIG. 3. The two transistors are suitably biased to conduct, given the supply voltages VDDA and VSSA, as shown, and the two transistors are suitably balanced so the two branches of the current mirror will have similar characteristics. In the FIG. 3 embodiment the NMOS transistor MNSETUP (14), has a device width W=30 u, length L=2.1 u, and a mult=4; and NMOS transistor MNMIR (16) has W=30 u, L=2.1 u, and mult=64. The ratio of mult. is the current gain, 64/4=16×250 uA=4000 uA=4 mA, as shown in the drain lead of NMOS transistor MNMIR (12) of FIG. 3. The 4 ma current flows through the termination resistor connected between outputs DATA and DATAB.

Once the current sources of 4 mA are established in the top and bottom portions of the transmit driver, at the current mirrors in circled areas 11 and 15, the gate biasing predriver circuit portion of the transmit driver, shown as the circled areas 30, 31, 32 and 33, selectively bias the current steering switch transistors, MPSW1, MPSW2, MNSW1, MNSW2. As shown in FIG. 3, the current steering switches are the two PMOS and NMOS pairs. The current steering switch transistors work in pairs, and are labeled MPSW1, MNSW2 (which together control the current injected into the output DATA, for positive output data source A), and MPSW2, MNSW1 (which together control the current injected into the output DATAB, for negative output data source B). Note that MPMIR is always sourcing 4 ma current, and MNMIR is always sinking 4 ma current. The current steering switching just determines the direction of current flow through the termination resistor.

The transmitter states for DATA and DATAB can be given by the following table:

| State | DATA | DATAB | CM | CP | TRI |
|---|---|---|---|---|---|
| 0 | Sink | Source | 1 | 0 | 0 |
| 1 | Source | Sink | 0 | 1 | 0 |
| Z | High-Z | High-Z | 1 | 1 | 1 |

As is known from MOSFET switching theory, the operation of a MOSFET having gate, source and drain is separated into three different modes—cut-off, linear and saturation—depending on the voltages at the terminals. For example, for an nMOSFET, the three regions are: cut-off (no conduction) when $V_{GS}<Vt$, where $V_{GS}$ is the voltage between gate to source and Vt is the threshold voltage of the transistor; triode or linear region (conduction occurs and the transistor acts like a resistor, controlled by the gate voltage), when $V_{GS}>Vt$, and $V_{DS}<V_{GS}-Vt$, where $V_{DS}$ is the voltage between drain to source; and saturation, when $V_{GS}>Vt$ and $V_{DS}>V_{GS}-Vt$. A similar device characterization exists for a pMOSFET, which is the mirror image of the nMOSFET along the Id-Vgs curve, with the difference being for a pMOSFET that for cut-off, $V_{GS}>Vt$; for the linear region, $V_{GS}<Vt$; for saturation, $V_{GS}<Vt$, and Vt is <0 for PMOS as is known per se in the art.

Analogous relationships exists for other types of transistors, all of which are suitable for the present invention, with modifications that one of ordinary skill could make using the teachings of the present invention. The present invention employs both pMOSFET and nMOSFET transistors on the same circuit, because of manufacturing efficiencies in doing so.

The predriver circuit of the transmit driver in FIG. 3 receives as input the signal traces CP(20) and CM (10), forming the differential data inputs, and VTRI (30), the three-state control input. The function of the predriver circuit is, subject to the constraints imposed by the IEEE 1395 specification, to drive the current steering switches MPSW1, MNSW2 and MNSW1, MPSW2 in response to inputs CP and CM into the output differential signals DATA and DATAB. To this end, when the transistors labeled MPSW1 (PMOS) and MNSW2 (NMOS) are biased on (ON) to conduct, then current generated by the first current mirror (11), a current source, flows into DATA output and forms a positive differential voltage signal. When the transistors labeled MPSW2 (PMOS) and MNSW1 (NMOS) are biased ON to conduct, then negative current generated by the second current mirror (15), a current sink, flows into DATAB output and forms a negative differential voltage signal. More particularly, it is found that it is a significant part of the present invention that the four transistors labeled MPSW1, MPSW2, MNSW1, MNSW2 are biased ON to conduct not in their linear region, but are biased to saturation and kept in saturation mode when on, to improve characteristics and better meet the IEEE 1395 specification standard.

The biasing of the current steering switch MOSFET transistors labeled MPSW1, MNSW1, MPSW2 and MNSW2 is done through the application of voltage signals between the gate and source of the MOSFETs, via signal traces labeled TOP_P, TOP_M, BOT_P, BOT_M, each leading to the gates of the current steering switch transistors, as shown in FIG. 3, as well as the voltage signals CS_TOP, CS_BOT that lead to the source for MOSFET transistors labeled MPSW1, MNSW1, MPSW2 and MNSW2. Gate biasing predriver circuits, shown as the circled areas 30, 31, 32 and 33, control the voltage levels at the gate of each of the current steering switch MOSFET transistors labeled MPSW1, MNSW1, MPSW2 and MNSW2.

Figure 3A:
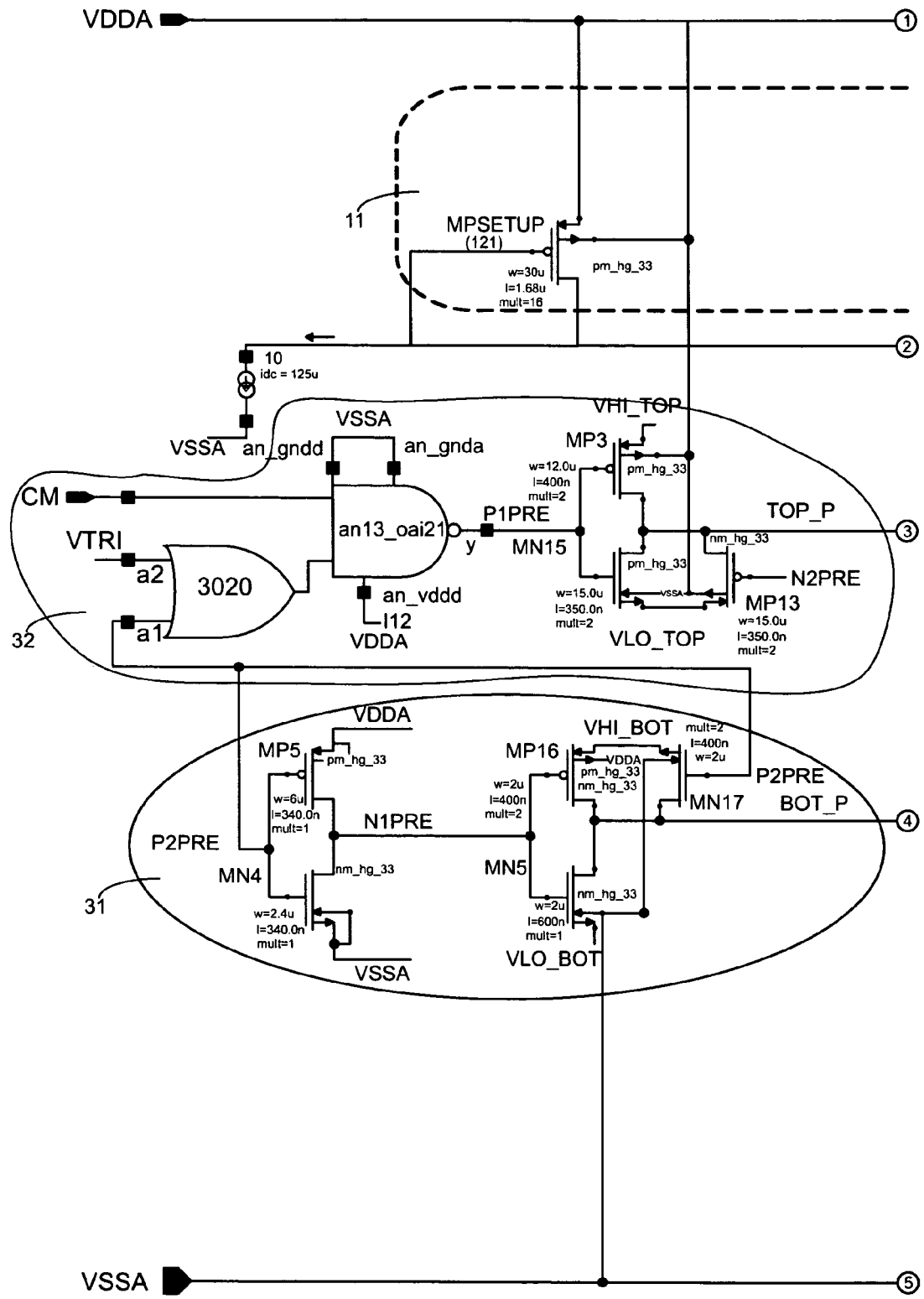
FIG. 3 (FIGS. 3A, 3B, 3C) illustrates the transmit driver (predriver waveform circuit) of the present invention.
Figure 3B:
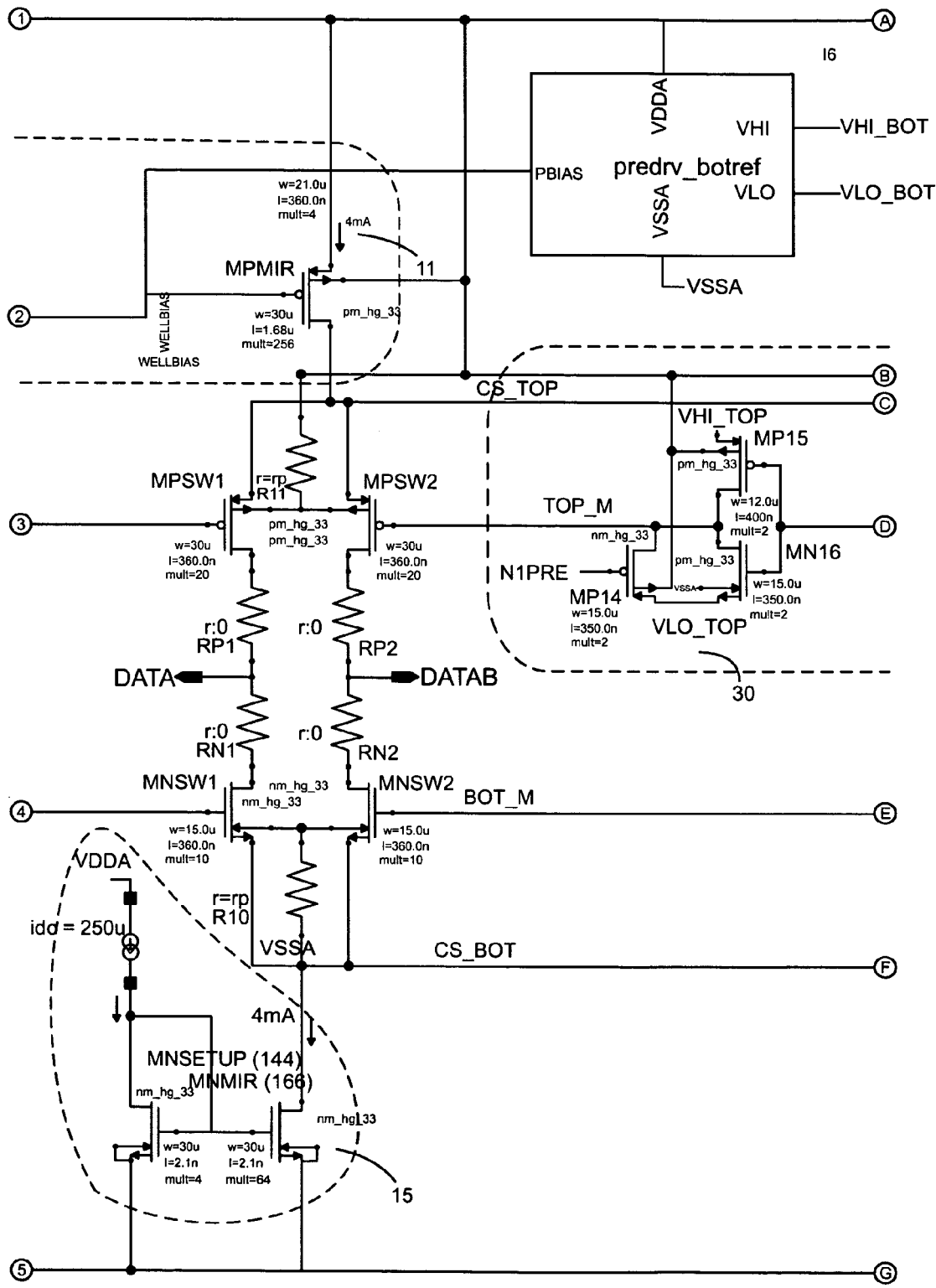
Figure 3C:
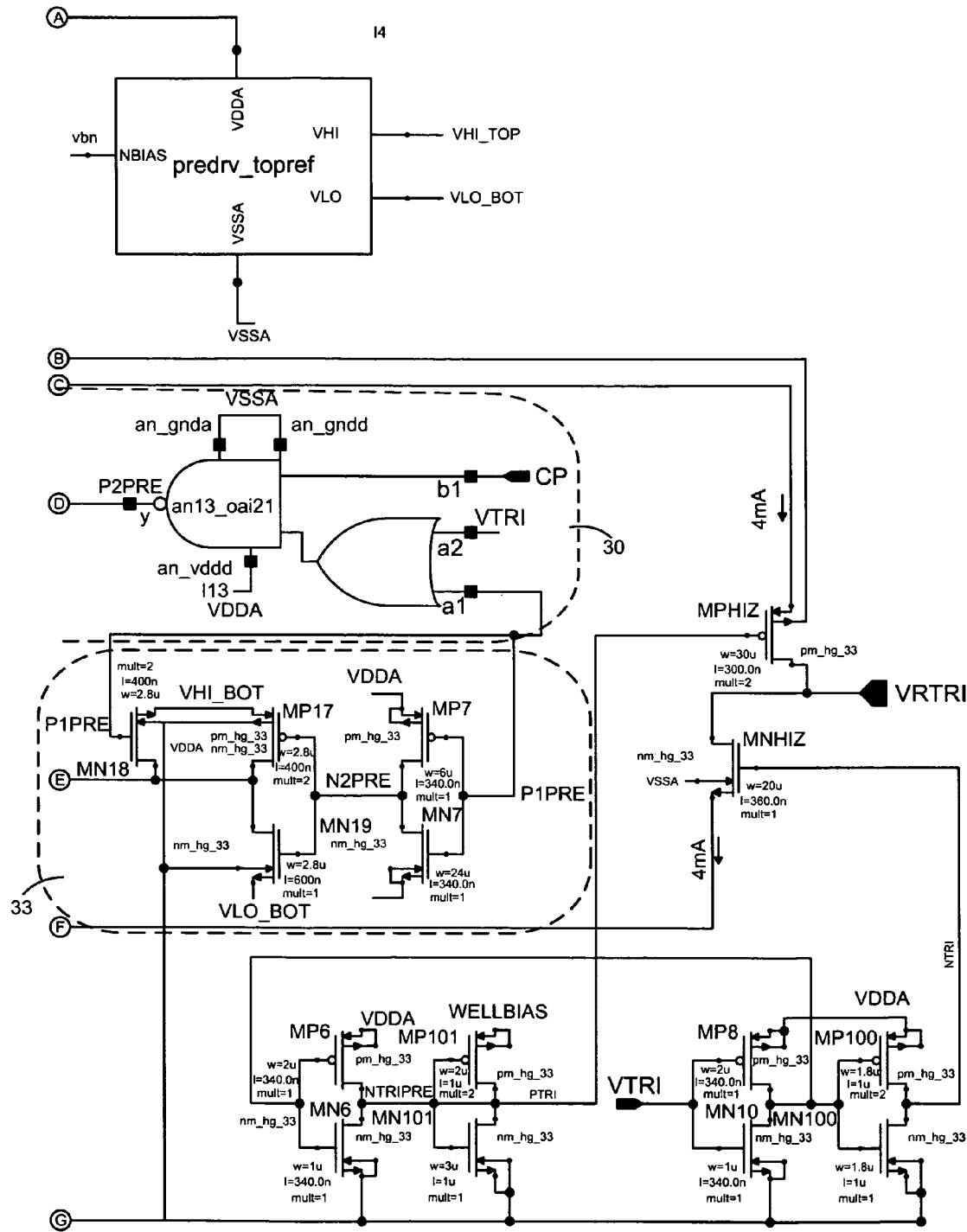
Figure 4A:
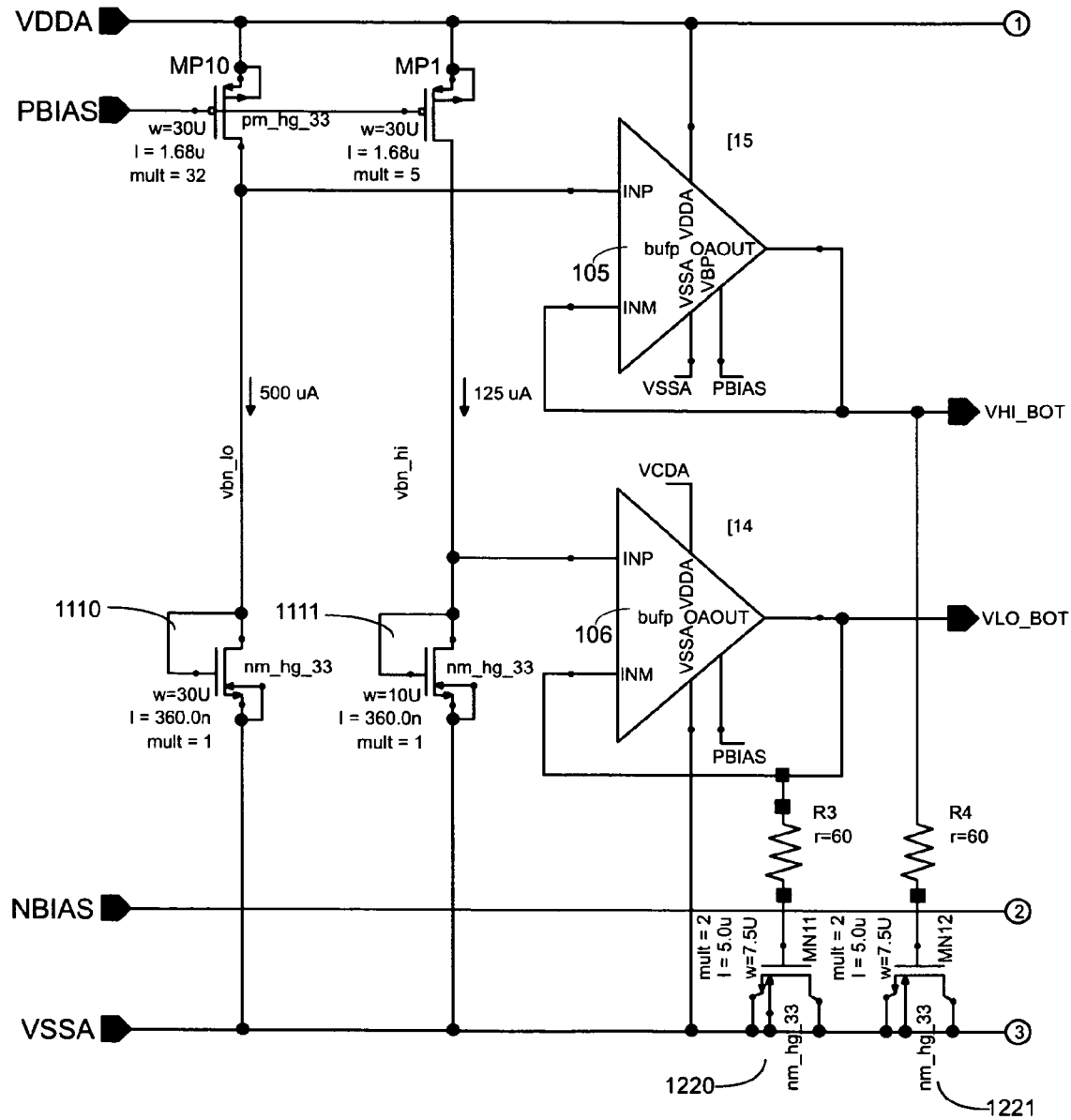
FIG. 4 (FIGS. 4A, 4B) illustrates the predriver reference generator for the present invention.
Figure 4B:
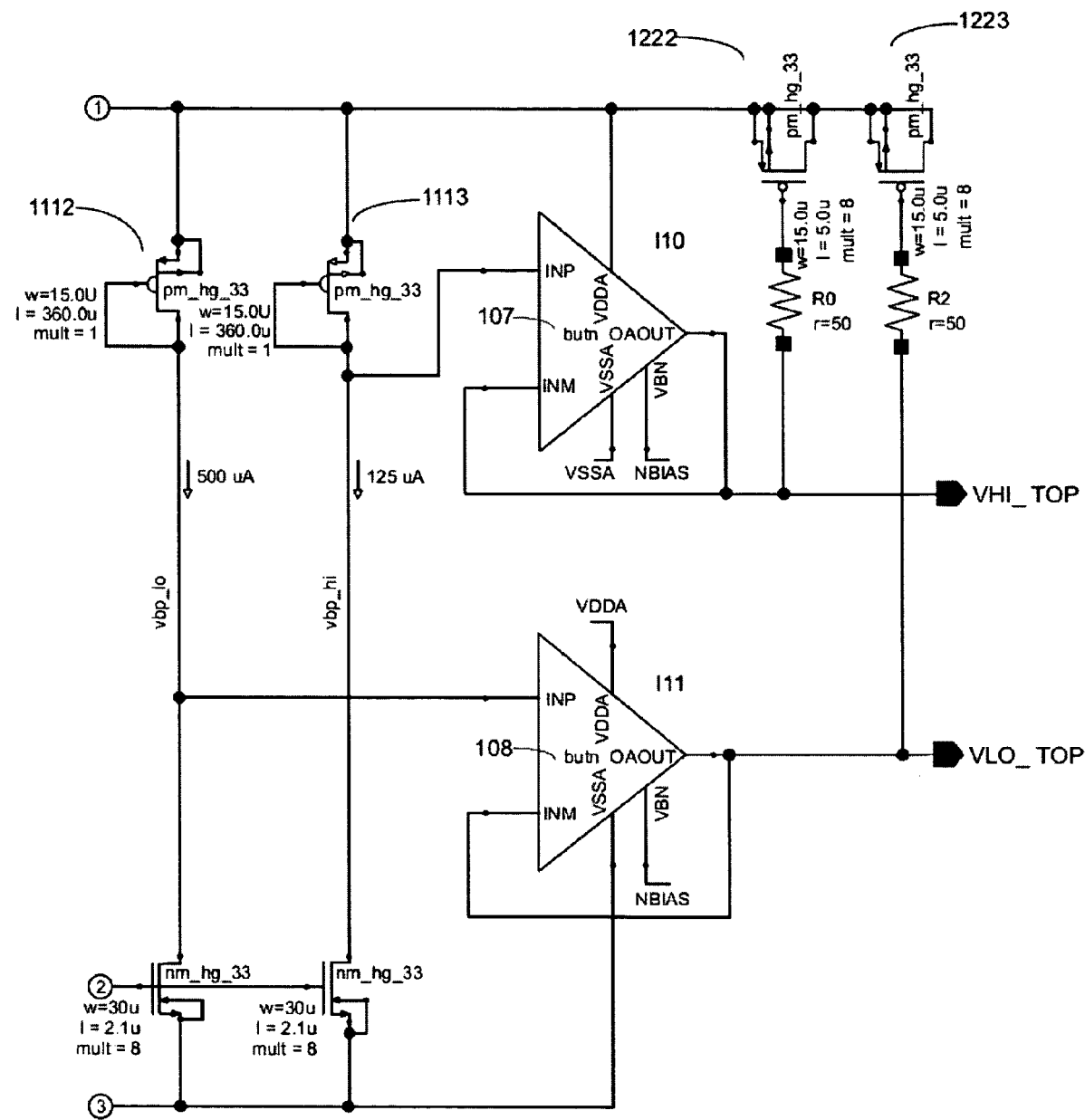

The strength and polarity of these signals TOP_P, TOP_M, BOT_P, BOT_M, and CS_TOP, CS_BOT is determined by predriver reference generator of FIG. 4 (shown as blocks labeled "predrv_botref" and "predrv_topref" in FIG. 3), which produces the voltages VHI_BOT, VHI_TOP, VLO_BOT, VLO_TOP. Any voltage drop that may occur across a MOS transistor from drain to source is ignored in these equations. In FIG. 3 the transistor regions (MP3, MN15), (MP15, MN16), (MP5, MN4), (MP17, MP19), (MP7, MN7), act as inverters. For example, if pMOSFET transistor MP3 (P-MOS) is turned on, then the voltage signal TOP_P=VHI_TOP. Likewise if nMOSFET transistor MN15 (N-MOS) is turned on, then the voltage signal TOP_P=VLO_TOP. Similar relationships hold for the other nodes, as can be appreciated by one of ordinary skill in the art from inspection of FIG. 3. Thus, by way of example and not limitation, if P-MOS transistor MP16 is ON, BOT_P=VHI_BOT; if N-MOS transistor MN5 is ON, BOT_P=VLO_BOT; if P-MOS transistor MP15 is ON, TOP_M=VHI_TOP; if N-MOS transistor MN16 is ON, then TOP_M=VLO_TOP; if P-MOS transistor MP17 is ON, BOT_M=VHI_BOT; if N-MOS transistor MN19 is ON, BOT_M=VLO_BOT. The voltages VHI_TOP, VLO_TOP, VHI_BOT, VLO_BOT relate to and are bounded by the supply voltages VDDA and VSSA. The TOP suffix voltages, VHI_TOP, VLO_TOP are close to (but less than) VDDA, while the BOT suffix voltages, VHI_BOT, VLO_BOT are close to (but less than) VSSA. The difference between VLO and VHI on both the TOP and BOT suffix voltages is just enough to fully switch the current-steering switches MPSW1, MNSW2 and MNSW1, MPSW2.

One aspect of the present invention is that the voltages VHI_TOP, VLO_TOP, VHI_BOT, VLO_BOT correspond to but are always less than the supply voltages VDDA and VSSA, i.e. VDDA>VHI_TOP>VLO_TOP>VHI_BOT>VLO_BOT>VSSA that is, the gate-biasing voltages at the gate for the current-steering switches MPSW1, MPSW2 and MNSW1, MNSW2 are for reduced-swing gate drive. This produces an advantage over transmit drivers that use full-swing (VDDA to VSSA) gate drive.

Further regarding the gate-biasing MOS transistors that bias the gates of the current-steering switches MPSW1, MNSW2 and MPSW2, MNSW1, FIG. 3 shows that the gate-biasing MOSFET transistors that bias the gate of switching transistors MPSW1, MNSW2, MPSW2, MNSW1 have an asymmetrical layout in parallel. For example, transistor MP3 (biased at the source by voltage signal VHI_TOP) and transistor MN15 (biased at the source by voltage signal VLO_TOP) are asymmetrically laid out in parallel, as nMOSFET transistor MN15 has an additional transistor, pMOSFET MP13. The reason for this asymmetrical layout is that there is a high threshold voltage for turning on the transistors, which can be seen to be repeated for the other gate biasing MOSFET transistors (e.g. MP15 (VHI_TOP), MN16 and MP14 (VLO_TOP); MN5 (VLO_BOT), MP16 and MN17 (VHI_BOT); MN19 (VLO_BOT), MP17 and MN18 (VHI_BOT). Hence, taking transistors MP3 and MN15, MP13, when the voltage at the source for MP3, VHI_TOP, is biased with respect to the voltage at the gate (at node P1PRE at area 32), such that the transistor MP3 is out of cut-off mode (and conducting), then transistor MP3 conducts, while the other transistor MN15 is cut-off; if the voltage at the source for MN15, VLO_TOP, is biased to the voltage at the gate (at node P1 PRE at area 32), such that the transistor MN15 is out of cut-off mode (and conducting), then transistor MN15 conducts, but most importantly, if the voltage presented at the gate (at node P1PRE at area 32) is "half-way" between the values needed to fully conduct for either transistor MP3 or MN15, then neither NMOS or PMOS would be fully turned on to conduct, but for the presence of additional transistor MP13. Thus this "parallel asymmetrical layout" in gate biasing predriver circuits results in a faster switching, since if the voltage presented at the gate (at node P1PRE at area 32) is neither close to VHI_TOP or VLO_TOP, the asymmetrical layout of the gate biasing MOSFET transistors at 62 can quickly nevertheless switch, resulting in faster throughput for the entire transmit driver of FIG. 3. Similar logic applies for the other gate-biasing MOSFETs at the other gate biasing predriver circuits regions, such as MP15 (VHI_TOP), MN16 & MP14 (VLO_TOP); MP16 & MN17 (VHI_BOT), MN5 (VLO_BOT); MP17 & MN18 (VHI_BOT), MN19 (VLO_BOT)).

When the gate biasing MOSFETs are conducting (i.e., out of cutoff), they act as inverters, and the values of voltages for each of the current steering switches transistors labeled MPSW1, MNSW1, MPSW2, MNSW2 are as follows: voltage at node TOP_P=VHI_TOP or VLO_TOP (depending on which transistors MP3 or MN15, MP13 are conducting on or turned off); voltage at node TOP_M=VHI_TOP or VLO_TOP (depending on which transistors MP15 or MN16, MP14 are conducting on or turned off); voltage at node BOT_P=VHI_BOT or VLO_BOT (depending on which transistors MP16, MN17 or MN5 are conducting on or turned off); and voltage at node BOT_M=VHI_BOT or VLO_BOT (depending on which transistors MP17, MN18 or MN19 are conducting on or turned off). Even more particularly, as can be appreciated by one of ordinary skill by inspection of FIG. 3, when node P1PRE is high at area 32 and transistors MN15 and MP13 are on, then TOP_P=VLO_TOP. When P1PRE is low at area 32 and transistor MP3 is ON, TOP_P=VHI_TOP. Similar relationships are present for the other nodes TOP_M, BOT_P, BOT_M, as can be appreciated by one of ordinary skill from inspecting the circuit of FIG. 3 and using the teachings herein.

The voltages VHI_TOP, VLO_TOP, VHI_BOT, VLO_BOT correspond to the supply voltages VDDA and VSSA according to the relationship VDDA>VHI_TOP>VLO_TOP>VHI_BOT>VLO_BOT>VSSA. The TOP suffix voltages, VHI_TOP, VLO_TOP are close to VDDA and the BOT suffix voltages, VHI_BOT, VLO_BOT are close to VSSA. The difference between VLO and VHI on both the TOP and BOT suffix voltages is just enough to fully switch the current-steering switches MPSW1, MPSW2 and MNSW1, MNSW2.

Turning attention now to FIG. 4 there is shown schematic details of the predriver reference generator (labeled 'predrv_botref' and 'predrv topref' in FIG. 3) that produces the signals VHI_TOP, VLO_TOP, VHI_BOT, VLO_BOT which outputs these signals transmit driver of FIG. 3 that ultimately become the gate biasing portion signals TOP_P, TOP_M, BOT_P, BOT_M to the current steering switches MPSW1, MPSW2, MNSW1 and MNSW2. The voltages VHI_TOP, VLO_TOP are close to voltage VDDA (+3.3V) while voltages VHI_BOT and VLO_BOT are close to VSSA (0V).

To this end, the op-amps 105, 106, 107, 108 shown in FIG. 4 act as unity gain follower buffers (G=1) and are employed to drive the capacitance of the gates so the gates can switch more quickly.

In FIG. 4 the inputs are VDDA (power supply), PBIAS, NBIAS and VSSA (power supply), while the outputs are VHI_TOP, VLO_TOP, VHI_BOT and VLO_BOT. PBIAS and NBIAS are as shown in order to establish the labeled current levels in the transistors MP1, MP10, MN3, MN4.

Devices 1110, 1111 operate as diodes (diode connected NMOS devices) while devices 1112, 1113 also operate as diodes (diode connected PMOS devices) to conduct current in the direction of the arrows shown.

The nMOS transistors 1220, 1221 lead to voltages VHI_BOT and VLO_BOT, as shown, while the pMOS transistors 1222, 1223 lead to the voltages VHI_TOP and VLO_TOP. The voltage differential between VHI_BOT and VLO_BOT versus VHI_TOP and VLO_TOP is created by the device width and lengths of the nMOS transistors 1220, 1221 versus the pMOS transistors 1222, 1223, as indicated in FIG. 4, i.e. the width of the pMOS transistors is double the nMOS transistors, and the 'mult' factor is 4×, where, w total=w*mult. The NMOS transistors 1220, 1221 and resistors R3, R4 are for compensating the opamps to insure stability and overdamped transient response. Similarly, the PMOS side, PMOS transistors 1222, 1223 and resistors R0, R2 serve the same purpose, compensating the opamps to insure stability and overdamped transient response. Essentially the transistors are serving as gate capacitors.

One of the objectives of the present invention is to use the predriver reference generator of FIG. 4 working with the transmit driver of FIG. 3 to maintain the voltage CS_TOP as close to (but less than) VDDA (the supply voltage) as possible, and likewise the voltage CS_BOT as close to (but less than) VSSA (supply) as possible, all the while keeping the key current steering switch MOSFET transistors labeled MPSW1, MNSW1, MPSW2 and MNSW2 in saturation mode as much as possible when conducting ON. One advantage of employing saturation mode is it decouples the current steering switches from the DATA and DATAB output load. Further, the closer the CS_TOP and CS_BOT voltages are to the VDDA and VSSA voltages, the less ripple is produced (shown in the waveform graphs herein). In the present invention, voltage CS_TOP=VLO_TOP−VGS (MPSW1), where VGS is negative. Similar relationships can be found for CS_BOT related to VLO_BOT, based on VGS (MNSW1), e.g., CS_BOT=VLO_BOT−VGS (MNSW1), when transistor MPSW1 is ON, as one of ordinary skill in the art can appreciate by inspection of FIG. 3 from the teachings herein. VLO_TOP and VLO_BOT are produced by the predriver reference generator of FIG. 4, and one purpose of the present invention is to maintain the voltage CS_TOP as close to VDDA (supply voltage) as possible, and likewise the voltage CS_BOT as close to VSSA (supply) as possible. As can be appreciated by one of ordinary skill in the art from the teachings herein, Vgs=Vth+delta_Vgs as determined by the square-equation for MOS devices—Ids=k/2*W/L*(Vgs−Vth)^2. This is important because the Vth term in the MOS diode and the Vth term in the switch transistor cancel out, resulting in better control on the CS_TOP and CS_BOT voltages (determined by transistor size ratios and current ratios only). The differential voltage for driving the current steering switches (VHI-VLO) is also set by current and sized ratios in the diode pair. This practice makes the circuit of the present invention insensitive to process variations.

Figure 5:
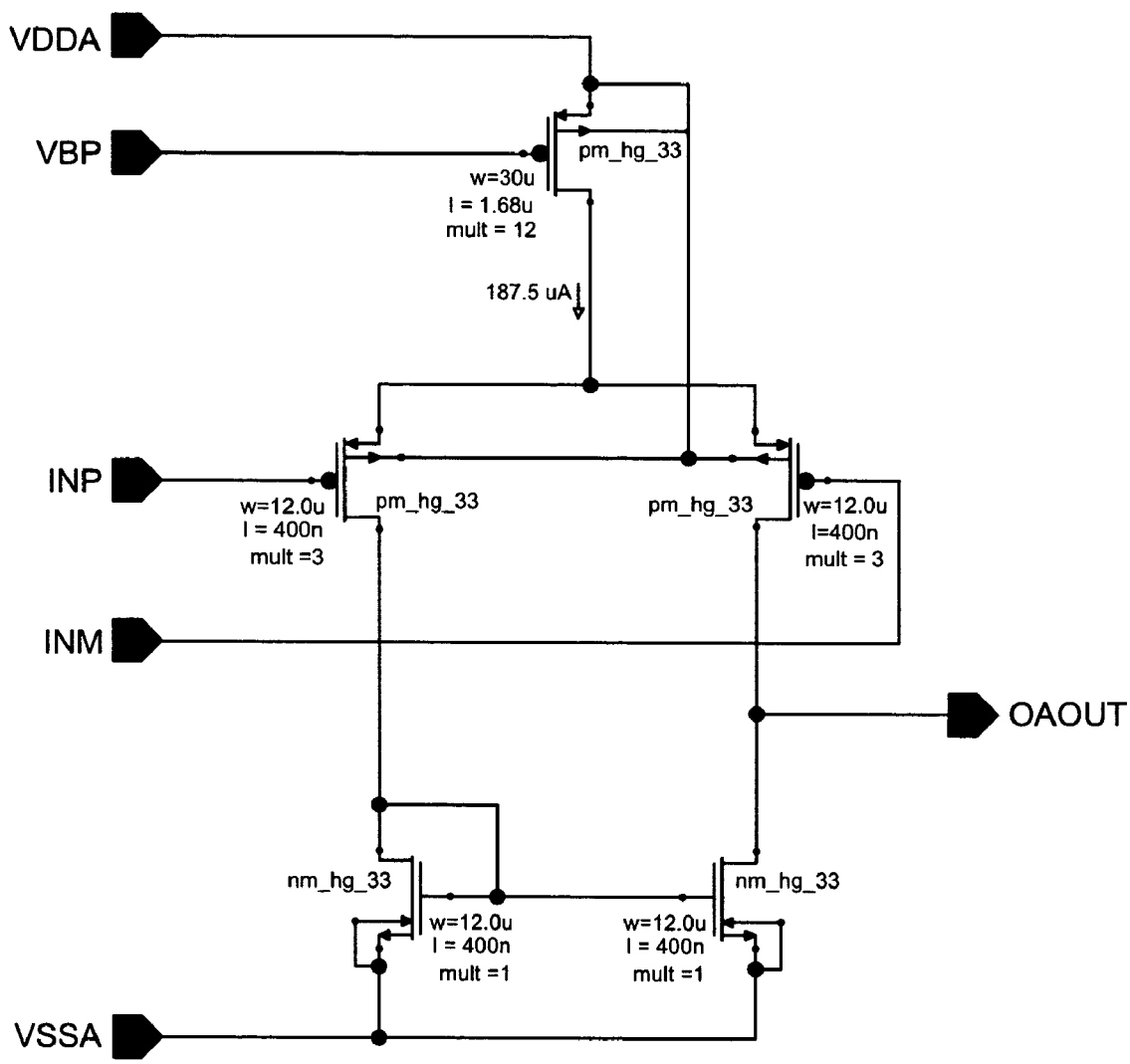
FIG. 5 illustrates an instantiation of an P-channel input op-amp for the present invention.
Figure 6:
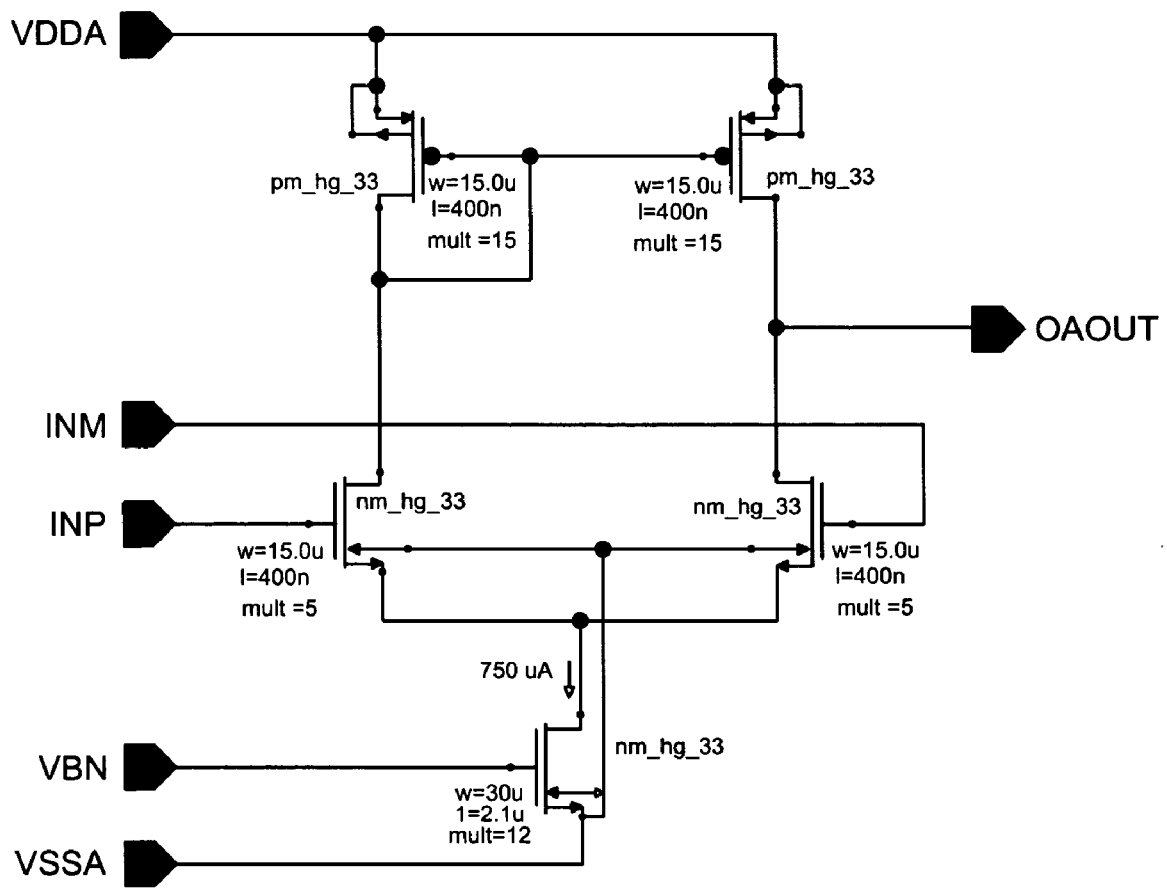
FIG. 6 illustrates an instantiation of an N-channel input op-amp for the present invention.

FIG. 5 illustrates the P-channel input op-amp for the present invention used in FIG. 4. The values of the MOS transistors disclosed therein are merely illustrative, and can be suitable varied. Likewise FIG. 6 illustrates the N-channel input op-amp used in FIG. 4 of the present invention. The values of the MOS transistors disclosed therein are merely illustrative, and can be suitable varied. Any other suitable op-amp may be employed as a unity gain follower (G=1) in the present invention as taught herein; the two circuit diagrams of FIGS. 5 and 6 are merely representative examples of one such instantiation of op-amp.

Figure 7:
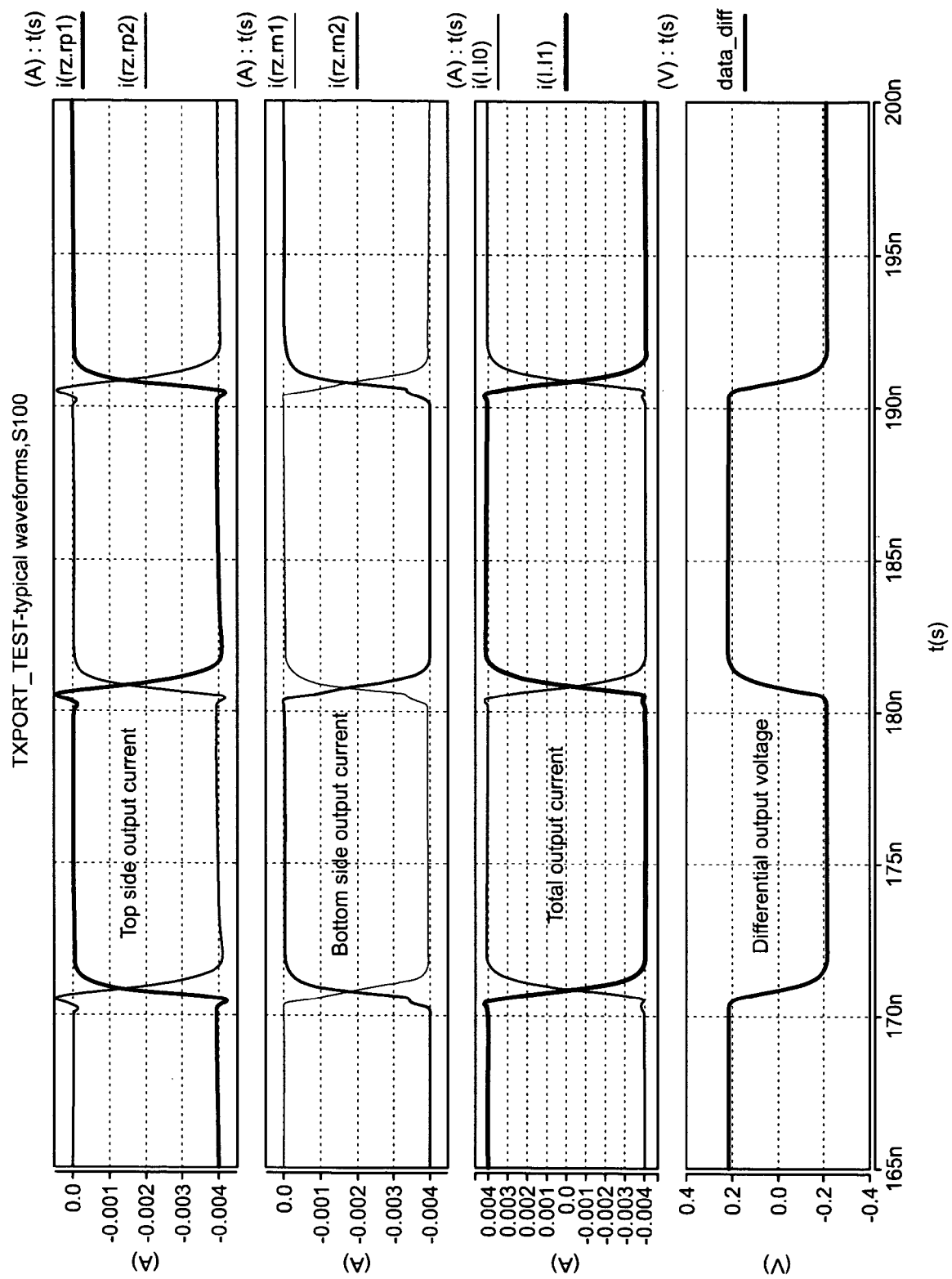
FIG. 7 illustrates driver output current and voltage waveforms generated by the present invention.

FIG. 7 illustrates driver output current waveforms for the present invention. The graph shows current (A) versus time (ns) for various nodes. For example, the legend in the right hand side of each graph in FIG. 7 means as follows: the notation i(rz.rp1) for "Top side output current" means "the current flowing through resister RP1", where RP1 is the circuit element shown in FIG. 3B, while the notation i(rz.rp2) means "the current flowing through resister RP2", where RP2 is shown in FIG. 3B just above DATAB. Likewise, the notation for "Bottom side output current", i(rz.rn1), means "the current flowing through resister RN1", where RN1 is shown in FIG. 3B, while the notation i(rz.rn2) means "the current flowing through resister RN2", where RN2 is shown in FIG. 3B. Note the six resistors shown in FIG. 3B connected to the four current steering switch transistors MPSW1, MPSW2, MNSW1, MNSW2—resistors RP1, RP2, RN1, RN2 and the two unmarked resistors at the top and bottom—are not real circuit elements in the sense that one might find them etched on a silicon wafer, but are used in ASIC/circuit schematic netlists to denote resistance for simulation purposes.

Further in FIG. 7, labeled "Total output current", there is shown the total output current, i(I.I0)=the current out of DATAB port in FIG. 3, and i(I.I1)=the current out of DATA port in FIG. 3. The final graph, labeled "Differential output voltage", shows the voltage difference of DATA and DATAB outputs in FIG. 3, data_diff=voltage (DATA)−voltage (DATAB).

Figure 8:
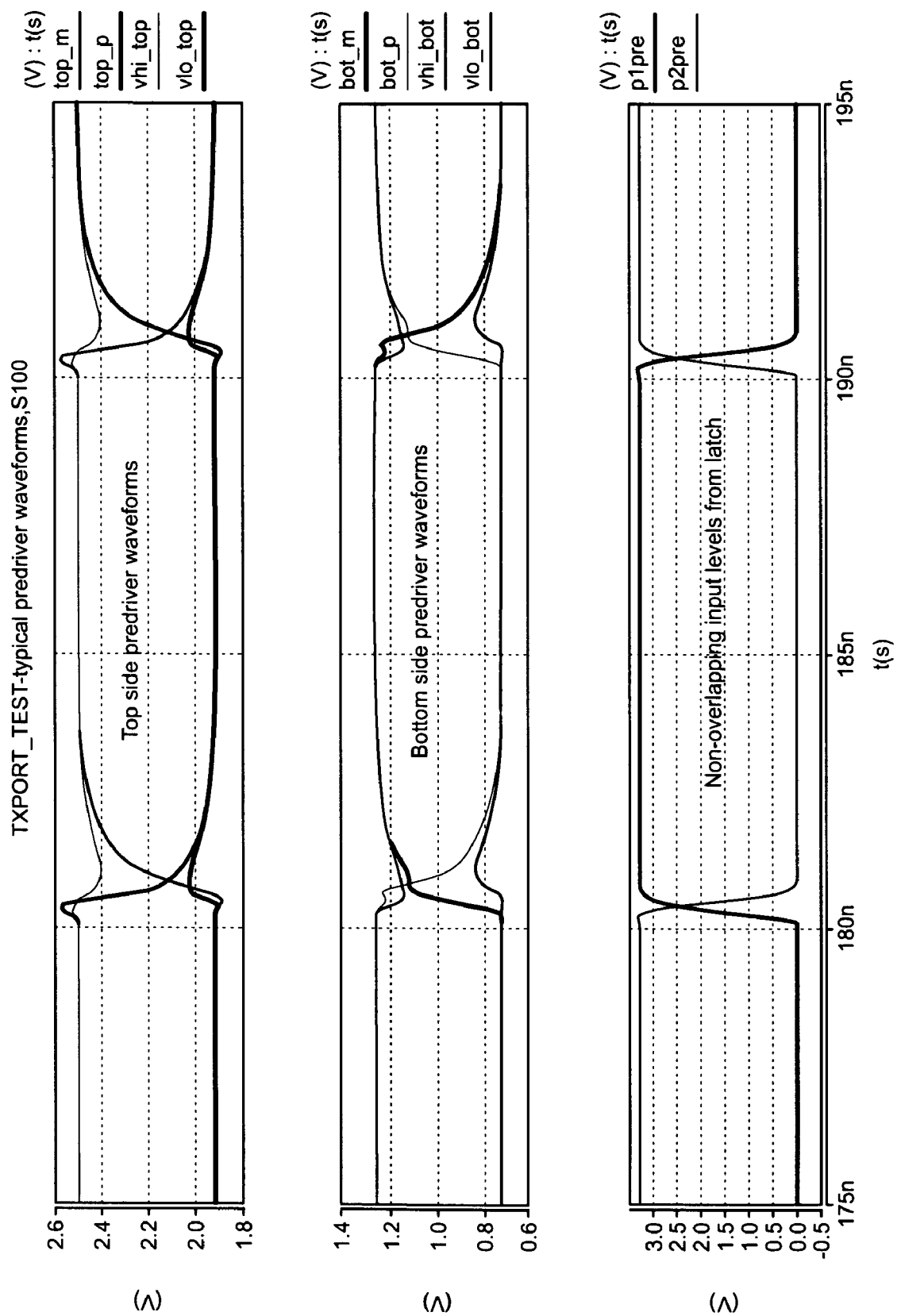
FIG. 8 illustrates the certain "make-before-break" aspects of the current steering switch predriver waveforms generated by the present invention.

FIG. 8 illustrates the current steering switch predriver waveforms. The graph shows voltage (V) versus time (ns) for the top side and bottom side predriver waveforms and the non-overlapping input levels from the RS latch, P1PRE and P2PRE in FIG. 3, as discussed further herein The term "non-overlapping" is loosely used in this case. This is really only true after inversion of the shown latch waveforms. However, the important characteristic is achieving "make before break" operation of the current steering switches, as the top and bottom side predriver waveforms illustrate. For PMOS the crossover point should be low, and for NMOS high.

Figure 9:
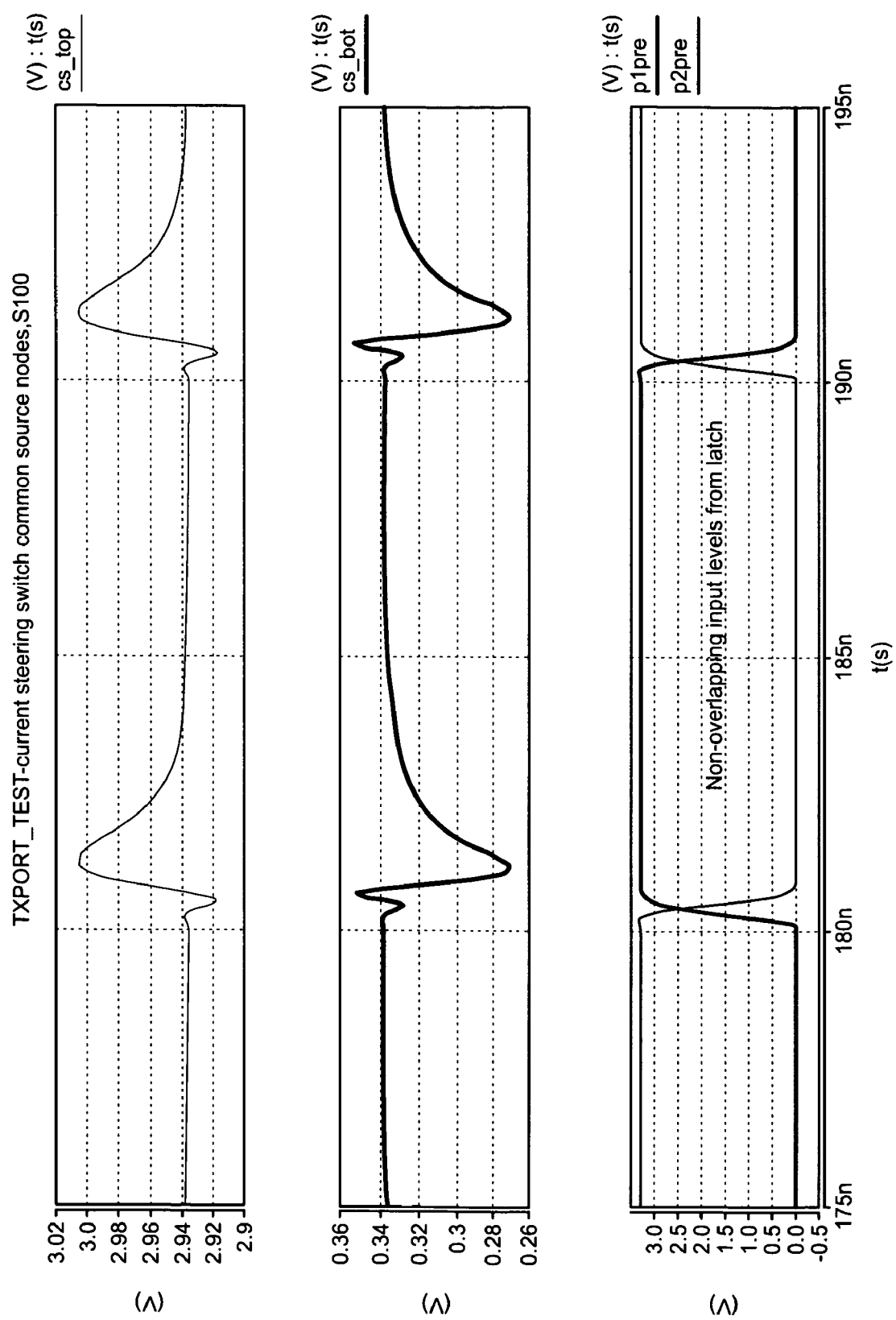
FIG. 9 illustrates the predriver current waveforms generated by the present invention.

FIG. 9 illustrates the predriver current waveforms for the present invention, as labeled in the right hand side margin of the graphs. The graph shows voltage (V) versus time (ns) for the nodes in FIG. 3 comprising CS_TOP, CS_BOT, P1PRE and P2PRE. FIG. 9 also shows the non-overlapping input levels from a R-S latch formed from the NAND gates for FIG. 3 concerning P1PRE and P2PRE as explained further herein.

FIGS. 7-9 also illustrate, at the transient spikes, the concept of the present invention involving "make before break" circuit connections when switching between outputs DATA and DATAB by the current steering switch transistors. These transient spikes would be greater than as shown if the present invention did not employ "make before break" connections. Make-before-break connections involve always having a path for current to travel to, even if the current is not being used for signaling purposes. Make-before-break involves turning on the key current steering switches (MPSW1, MPSW2, MNSW1 and MNSW2), preferably in saturation mode, before the it is time for them to transmit data, e.g., turning on the pair MPSW1 and MNSW2 (i.e., biasing them from cutoff to saturation mode), which are responsible for outputting data to output DATA, before the pair MNSW1, MPSW2, which are responsible for outputting data to output DATAB, have finished outputting current to output DATAB.

Thus, concerning the "make before break" circuit connections, there is shown in FIG. 3 a "cross-coupled" feedback connection required to form an RS latch, as can be seen by one of ordinary skill using the teachings therein. By way of example and not limitation, there is shown nodes P1PRE and P2PRE in the form of input to the circled areas 30, 31, 32, 33. Both P1PRE and P2PRE are driven by NAND gates as shown in circled areas 30, 32 in FIGS. 3A and 3C. If VTRI is low, the NOR gate (labeled "3020") in FIG. 3A at area 32 has no effect. Looking at FIG. 3A and 3C: the first NAND gate input, shown in circled area 32 (FIG. 3A) is from CM, the second NAND gate input is from P2PRE (tracing the line to the same symbolic named node point P2PRE). But P2PRE is also the output of the other NAND gate at circled area 30 (FIG. 3C). The net effect of this feedback is to create a level triggered R-S (S-R) flip-flop.

As is known per se, a clocked S-R ("set/reset") flip-flop sets (i.e., changes its output to logic 1, or retains it if it is already 1) if both the S ("set") input is 1 and the R ("reset") input is 0 when the clock is strobed. The flip-flop resets (i.e., changes its output to logic 0, or retains it if it is already 0) if both the R ("clear") input is 1 and the S ("set") input is 0 when the clock is strobed. If both S and R are 0 when the clock is strobed, the output does not change. If both S and R are 1 when the clock is strobed, no particular behavior is guaranteed. Sometimes the behavior of the flip-flop is described by what is termed the characteristic equation, which derives the "next" (i.e., after the next clock pulse) output, Qnext, in terms of the input signal(s) and/or the current output, Q, or, in the form of a truth table:

| S | R | Q | Qnext |
|---|---|---|-------|
| 0 | 0 | 0 | 0 |
| 0 | 0 | 1 | 1 |
| 0 | 1 | X | 0 |
| 1 | 0 | X | 1 |
| 1 | 1 | X | unstable |

Where X = don't care condition

As can be seen, the output Qnext (the next output state of the S-R circuit after the clock is strobed) is guaranteed to be a particular state (i.e. either a 1 or a 0) after a clock pulse, when S and R are opposite values (i.e. 0 and 1, or 1 and 0). In the present invention the RS latch is not a clocked latch as in the table above but a level driven latch driven by clocked flip flops, and S (set) and R (reset) are active low, however, the net effect is that, based on the biasing voltages of P1PRE and P2PRE, either one or the other of the current steering switches MPSW1 or MNSW1 will be conducting at any given time, either MPSW1 (which together with MNSW2 controls the current injected into output DATA) or MNSW1 (which together with MPSW2 controls the current injected into output DATAB), as can be seen from following the relative biasing voltages on the current steering switches as explained herein, with little or no overlap between the states, but with a current path available at all times for the current produced by the current mirrors to follow. By way of example and not limitation in FIG. 3, as can be appreciated by a skilled artisan from the teachings herein, the cross-coupled S-R flip flop comprises, for differential data input CP, inputs "a2" at the VTRI OR gates, and inputs "a1". Thus the Tri-state mode has a similar "make or break" connection as the current steering switch transistors, as explained herein, to allow continuity for current flow. The effect of employing a "make-before-break" connection is shown graphically in FIG. 9, which shows the non-overlapping voltage input levels P1PRE and P2PRE from the R-S latch.

Make-before-break connections work in conjunction with maintaining the voltage CS_TOP as close to VDDA (supply voltage) as possible, and likewise the voltage CS_BOT as close to VSSA (supply voltage) as possible, all the while keeping the key current steering switch MOSFET transistors labeled MPSW1, MNSW1, MPSW2 and MNSW2 in saturation as much as possible. In order for the driver delay to be independent of output common-mode voltage, all current steering must remain in saturation. This practice assures that the CS_TOP and CS_BOT voltages do not change with common-mode level. The nodes associated with CS_TOP and CS_BOT voltages have relatively high capacitance and cannot change quickly. Make-before-break switch sequencing (from the RS latch predriver) also minimizes transient on the CS_TOP and CS_BOT nodes.

Regarding Tri-state mode, the input VTRI in FIG. 3 is for Tri-state. Current is turned off in Tri-state mode, so current steering switch transistors MPSW1 and MNSW2 are simultaneously pulled high, and current steering switch transistors MPSW2 and MNSW1 are simultaneously pulled low to shut off current to the outputs DATA and DATAB completely. The purpose of the NOR gates ("3020" at area 32) and the NOR gate at area 30) is to "break" the feedback loop in the RS latch and allow both outputs to be set low simultaneously. CP and CM are forced low by the flip-flops in FIG. 2. For Tristate mode, HIZN18 (FIG. 2) is low. Tri-state mode has a similar "make or break" connection as the current steering switch transistors, as explained herein, to allow continuity for current flow.

MPHIZ and MNHIZ (FIG. 3C) are turned ON by VTRI going high. VRTRI is biased to VDD/2 to permit a path for current if the 4 ma current source and sink do not match exactly. Only the difference of these 2 current sources will flow into this node. The current which normally would have flowed to outputs DATA and DATAB will instead follow the paths opened by transistors MPHIZ and MNHIZ.

The method of the present invention comprises using the apparatus outlined above to send a differential signal via current loop signaling in a manner consistent with the IEEE 1394 standard.

Further, although the present invention has been described in terms of the preferred embodiments above, numerous modifications and/or additions to the above-described preferred embodiments would be readily apparent to one skilled in the art.

It is intended that the scope of the present invention extends to all such modifications and/or additions and that the scope of the present invention is limited solely by the claims set forth below.

I claim:

1. A differential current mode serial-bus driver circuit for the IEEE 1394 standard, comprising:
 a transmit driver for driving differential signals forming a differential signal pair in current loop signaling, the transmit driver comprising a pair of current steering switches operatively connected to a pair of current mirrors, further comprising,
 a first current mirror providing a positive current for said transmit driver to produce a positive differential voltage signal for the differential signal pair; and,
 a second current mirror providing a negative current for said transmit driver to produce a negative differential voltage signal for the differential signal pair, and a plurality of gate-biasing MOS transistors connected to bias the gates of the pair of current-steering switches, said first current steering switch comprising a pair of MOS transistors, and said second current steering switch comprising a pair of MOS transistors;

voltage signals applied to the source of said current-steering switch MOS transistors; andwherein the voltages produced by said gate-biasing MOS transistors and said source voltage signals bias said first and second current steering switches into saturation mode;

a first output for said positive differential voltage signal for the differential signal pair;

a second output for said negative differential voltage signal for the differential signal pair;

a pair of differential data inputs, having differential data input signals CP and CM, and a three-state control signal VTRI for DC signaling;

a make-before-break circuit connection operatively connected to said current steering switches for allowing current from said first and second current mirrors to be switched between said first and second output in response to differential data input signals CP and CM;

said transmit driver drives the differential signals in response to synchronized input waveforms, and, said pair of current steering switches comprises a first current steering switch comprised of transistors and a second current steering switch comprised of transistors;

said transmit driver is supplied by supply voltages VDDA and VSSA, wherein said transistors of said first current steering and said second current steering switch are biased by voltages having a value lying between the value of said supply voltages VDDA and VSSA.

2. The invention of claim 1, wherein:

said make-before-break circuit connection comprises a RS latch tied to said inputs and said gate-biasing MOS transistors.

3. The invention of claim 2, further comprising:

a circuit for synchronizing signals CP, CM and VTRI, prior to said signals being input into said transmit driver.

4. The invention according to claim 3, wherein:

said circuit for synchronizing signals CP, CM and VTRI comprises three flip-flops, one flip-flop connected to each signal CP, CM and VTRI, and, said pair of current-steering MOS transistors comprise a pair of PMOS and a pair of NMOS transistors.

5. A differential current mode serial-bus driver circuit for the IEEE 1394 standard, comprising:

a transmit driver for driving differential signals forming a differential signal pair in current loop signaling, the transmit driver comprising a pair of current steering switches operatively connected to a pair of current mirrors, further comprising, a first current mirror providing a positive current for said transmit driver to produce a positive differential voltage signal for the differential signal pair; and, a second current mirror providing a negative current for said transmit driver to produce a negative differential voltage signal for the differential signal pair, said transmit driver drives the differential signals in response to synchronized input waveforms, and, said pair of current steering switches comprises a first current steering switch comprised of transistors and a second current steering switch comprised of transistors;

said transmit driver circuit is supplied by supply voltages VDDA and VSSA, wherein said transistors of said first current steering and said second current steering switch are biased by voltages having a value lying between the value of said supply voltages VDDA and VSSA a plurality of gate-biasing MOS transistors connected to bias the gates of the pair of current-steering switches, said first current steering switch comprising a pair of MOS transistors, and said second current steering switch comprising a pair of MOS transistors;

voltage signals applied to the source of said current-steering switch MOS transistors; and wherein the voltages produced by said gate-biasing MOS transistors and said source voltage signals bias said first and second current steering switches into saturation mode; and an additional transistor at each said pair of MOS transistors comprising said first and second current steering switches so said current steering switches have an asymmetrical layout in parallel to provide for faster switching when switching said positive and negative currents.

6. The invention of claim 5, further comprising:

a predriver reference generator to generate voltages for said source voltage signals and said voltage produced by said gate biasing MOS transistors used to bias said first and second current steering switches into saturation mode.

7. The invention of claim 6, wherein:

said predriver reference generator generates a pair of said source voltage signals CS_TOP and CS_BOT for biasing said pair of current-steering switch MOS transistors, wherein CS_TOP is less than VDDA, the positive supply voltage of the transmit driver, and the voltage CS_ROT as less than VSSA, the negative supply voltage of the transmit driver.

8. The invention of claim 7, further comprising a first output for said positive differential voltage signal for the differential signal pair;

a second output for said negative differential voltage signal for the differential signal pair;

a pair of differential data inputs, having signals CP and CM;

a circuit for synchronizing signals CP, CM, and a three-state control signal VTRI for DC signaling, so said signals are all synchronized on the same clock edge, prior to said signals being input into said transmit driver, said circuit for synchronizing signals CP, CM and VTRI comprises three flip-flops, one flip-flop connected to each signal CP, CM and VTRI; and, said predriver reference generator that generates a pair of said source voltage signals CS_TOP and CS_BOT has said voltage signals set by current and sized ratios in a diode pair residing in said predriver reference generator, wherein said. circuit is insensitive to process variations.

9. A method for current loop signaling for a differential-signal driver and receiver for the IEEE 1394 standard, comprising the steps of:

providing a positive current with a first current mirror acting as a current source;

providing a negative current with a second current mirror acting as a current sink;

providing a transmit driver having a first output DATA and a second output DATAB, further comprising a pair of current steering switches to switch the positive current to the first output DATA and the negative current to the second output DATAB, the current steering switches comprised of transistors;

biasing the transistors in the current steering switches with voltage signals, the transistors of the current steering switches comprising a pair of MOS transistors, and the voltage signals applied to the gate terminal and to the source terminal of the MOS transistors, wherein the transistors are biased to conduct in saturation mode by the voltage signals;

providing a make-before-break connection circuit for the positive and negative currents to have a path to travel to whenever the transmit driver is in operation:

providing a pair of differential data inputs, having signals CP and CM, the MOS transistors for the current steering switches comprising two pairs of NMOS and PMOS transistors, one pair of these MOS transistors for the DATA output and a second pair of these MOS transistors for the DATAB output: the make-before-break connection involving turning on the positive current and negative current to be switched between DATA and DATAB outputs respectively, the make-before-break connections involve always having a path for positive and negative currents from the first and second current mirrors to travel to, even if the currents are not being used for signaling purposes at the outputs DATA and DATAB;

placing the two pairs of NMOS and PMOS transistors that form the current steering switches in saturation when these switches are conducting, by application of voltage from a predriver reference generator circuit generating a plurality of voltages lying between the value of the supply voltages VDDA and VSSA;

generating the plurality of voltages so that one of these voltages lies closer to VDDA than VSSA and the other of these voltages lies closer to VSSA than VDDA;

forming said make-before-break connection using an RS latch; and, providing DC common mode signaling in the transmit driver, wherein said transmit circuit is supplied by supply voltages VDDA and VSSA, and the transistors of the current steering switches are biased by voltages having a value lying between the value of the supply voltages VDDA and VSSA.

10. The method according to claim 9, further comprising:
providing an additional transistor at said pair of NMOS and PMOS transistors so said current steering switches have an asymmetrical layout in parallel to provide for faster switching when switching said positive and negative currents between DATA and DATAB.

11. A method for current loop signaling for a differential-signal driver and receiver for the IEEE 1394 standard, comprising the steps of:

providing a positive current with a first current mirror acting as a current source;

providing a negative current with a second current mirror acting as a current sink;

providing a transmit driver having a first output DATA and a second output DATAB, further comprising a pair of current steering switches to switch the positive current to the first output DATA and the negative current to the second output DATAB, the current steering switches comprised of transistors;

biasing the transistors in the current steering switches with voltage signals, the transistors of the current steering switches comprising a pair of MOS transistors, and the voltage signals applied to the sate terminal and to the source terminal of the MOS transistors, wherein the transistors are biased to conduct in saturation mode by the voltage signals;

providing a pair of differential data inputs to the transmit driver, having signals CP and CM, and a three-state control signal VTRI, providing a circuit to synchronize the signals CP, CM and VTRI prior to input to the transmit driver, the synchronization circuit comprising three positive edge triggered flip-flops, one flip-flop connected to each signal CP, CM and VTRI, and wherein said transmit circuit is supplied by supply voltages VDDA and VSSA, and the transistors of the current steering switches are biased by voltages having a value lying between the value of the supply voltages VDDA and VSSA, and wherein the method conforms to the IEEE 1394a-2000 specification, to achieve wide output range in voltage for the common-mode voltage, to minimize timing skew over a wide range of common-mode voltage ranges, and to achieve well-controlled rise/fall times in the edge rates of the digital signals transmitted by the transmit driver.

12. A differential current mode serial bus driver circuit for the IEEE 1394 standard comprising:
means for providing a first current source;
means for providing a second current source;
means for switching said first and second current sources comprising a transmit driver;
means for biasing said switching means with voltage signals;
means for supplying said circuit with supply voltages VDDA and VSSA;
means for synchronizing signals CP, CM and VTRI, forming data inputs and a three-state control signal for DC signaling, respectively, to said transmit driver switching means;
said means for providing a first and second current source comprise a first and second current mirror;
said transmit driver current switching means comprises a plurality of MOS transistors;
wherein said voltage biasing means biases said transmit driver switching means MOS transistors in saturation mode when said MOS transistors are ON,
said voltage biasing means biases said transmit driver switching means with voltages lying between the value of supply voltages VDDA and VSSA.

13. The circuit according to claim 12, further comprising:
means for providing a make-before-break current connection operatively connecting said first and second current mirrors with a path for the current produced by said current mirrors at all times.

14. The circuit according to claim 13, wherein:
said MOS transistors forming said transmit driver current switching means have an asymmetrical layout in parallel.

* * * * *